United States Patent
Yu

(10) Patent No.: US 7,435,916 B2
(45) Date of Patent: Oct. 14, 2008

(54) ELECTRONIC DEVICE REDUCING INFLUENCE OF SYSTEM NOISE ON SENSITIVITY OF ANTENNA

(75) Inventor: Jen-Huan Yu, Taipei (TW)

(73) Assignee: Compal Electronic, Inc., Taipei (TW)

( * ) Notice: Subject to any disclaimer, the term of this patent is extended or adjusted under 35 U.S.C. 154(b) by 61 days.

(21) Appl. No.: 11/672,967

(22) Filed: Feb. 9, 2007

(65) Prior Publication Data

US 2008/0078575 A1    Apr. 3, 2008

(30) Foreign Application Priority Data

Oct. 2, 2006    (TW) .............................. 95136526 A

(51) Int. Cl.
*H05K 9/00* (2006.01)

(52) U.S. Cl. .................. 174/380; 361/683; 361/816; 455/575.1; 455/575.7; 343/702

(58) Field of Classification Search ................ 174/380; 361/683, 816, 818; 455/575.5, 575.7; 343/702
See application file for complete search history.

(56) References Cited

U.S. PATENT DOCUMENTS

| | | | | |
|---|---|---|---|---|
| 5,373,300 A | * | 12/1994 | Jenness et al. | 343/702 |
| 5,677,698 A | * | 10/1997 | Snowdon | 343/770 |
| 5,913,174 A | * | 6/1999 | Casarez et al. | 455/557 |
| 6,531,985 B1 | * | 3/2003 | Jones et al. | 343/702 |
| 2008/0076356 A1 | * | 3/2008 | Conway et al. | 455/63.1 |

* cited by examiner

*Primary Examiner*—Hung V Ngo
(74) *Attorney, Agent, or Firm*—Jianq Chyun IP Office

(57) ABSTRACT

An electronic device including a first housing, a second housing, a signal cable, an insulating layer and an antenna is provided. The second housing is connected to the first housing and has a housing shielding layer on its inner surface. The signal cable extends from inside the first housing into the second housing and has a cable shielding layer on its outer surface. The insulating layer is disposed between the housing shielding layer and the cable shielding layer so as to electrically insulate the housing shielding layer from the cable shielding layer. The antenna is disposed inside the second housing. The insulating layer prevents the housing shielding layer from contacting the cable shielding layer so that the influence of the system noise on the sensitivity of the antenna can be reduced.

17 Claims, 2 Drawing Sheets

ELECTRONIC DEVICE REDUCING INFLUENCE OF SYSTEM NOISE ON SENSITIVITY OF ANTENNA

CROSS-REFERENCE TO RELATED APPLICATION

This application claims the priority benefit of Taiwan application serial no. 95136526, filed on Oct. 2, 2006. All disclosure of the Taiwan application is incorporated herein by reference.

BACKGROUND OF THE INVENTION

1. Field of the Invention

The present invention relates to an electronic device, especially to an electronic device reducing the influence of the system noise on the sensitivity of the antenna.

2. Description of Related Art

Owing to the development of technologies of the internet and the semiconductor, the internet reception/transmission interface has been widely used in some of the electronic devices, such as notebook computer, personal digital assistant (PDA) and the like. The wireless internet interface can even allow the users to log onto the internet with electronic devices free from the limitations of the conventional internet line and access the internet conveniently regardless of where they are. This development has made the wireless internet technology a heated trend in recent years.

Although it is rather convenient to use the wireless internet, since the wireless internet transmits signals through wireless electrical waves, the antenna used for receiving signals during reception or transmission of signals may be affected by the noise sent out from the surroundings and the electronic device itself and thus has a poor reception. As a result, the efficacy of the internet is significantly lowered or the internet cannot be used.

Taking the notebook computer as an example, the antenna of a notebook computer is usually located on the outer frame structure of the liquid crystal display (LCD), and the driver of the LCD generates a video clock. Some frequency composition of the video clock would overlap with the frequency of the antenna and result in interference. In addition, the clock-generating circuit of the notebook computer may also influence the sensitivity of the antenna. Therefore, reducing the influence of the system noise on the sensitivity of the antenna is vital to the application of the wireless internet.

SUMMARY OF THE INVENTION

An electronic device reducing the influence of the system noise on the sensitivity of the antenna is disclosed in the present invention.

In order to achieve the foregoing or other objects, the invention provides an electronic device including a first housing, a second housing, a signal cable, an insulating layer and an antenna. The second housing is connected to the first housing, and has a housing shielding layer on the inner surface of the second housing. The signal cable extends from inside the first housing into the second housing and has a cable shielding layer located on the outer surface of the signal cable. The insulating layer is disposed between the housing shielding layer and the cable shielding layer so as to electrically insulate the housing shielding layer from the cable shielding layer. The antenna is disposed inside the second housing.

In one embodiment of the present invention, the electronic device further includes a mother board disposed inside the first housing and coupled to one end of the signal cable inside the first housing.

In one embodiment of the invention, the mother board has a high frequency digital signal circuit layer and a reference plane. The outer side of the high frequency digital signal circuit layer corresponding to the mother board is covered by the reference plane.

In one embodiment of the invention, the reference plane is a ground plane or a power plane.

In one embodiment of the invention, the electronic device further includes a display module disposed inside the second housing and coupled to one end of the signal cable located inside the second housing.

In one embodiment of the invention, the second housing is pivoted to the first housing.

In one embodiment of the invention, the housing shielding layer is coupled to a radio frequency grounding, and the cable shielding layer is coupled to a digital grounding.

In one embodiment of the invention, the electronic device further includes at least a conducting net set inside the first housing so as to cover an opening on the first housing.

In one embodiment of the invention, the conducting net is coupled to a digital grounding.

In one embodiment of the invention, the conducting net is a metal net.

In one embodiment of the invention, the electronic device further includes at least a conducting cloth set inside the first housing so as to cover an opening on the first housing.

In one embodiment of the invention, the conducting cloth is coupled to a digital grounding.

In one embodiment of the invention, the conducting cloth is a metal cloth.

In one embodiment of the invention, the housing shielding layer is a metal layer.

In one embodiment of the invention, the housing shielding layer is an aluminum layer.

In one embodiment of the invention, the cable shielding layer is a metal layer.

In one embodiment of the invention, the cable shielding layer is a metal net.

The electronic device of the invention has an insulating layer disposed between the housing shielding layer and the cable shielding layer. The insulating layer prevents the housing shielding layer and the cable shielding layer from electrically contacting each other so that the influence of the system noise on the sensitivity of the antenna can be reduced.

In order to make the aforementioned and other objects, features and advantages of the present invention more comprehensible, preferred embodiments accompanied with figures are described in detail below.

DESCRIPTION OF EMBODIMENTS

Figure 1:
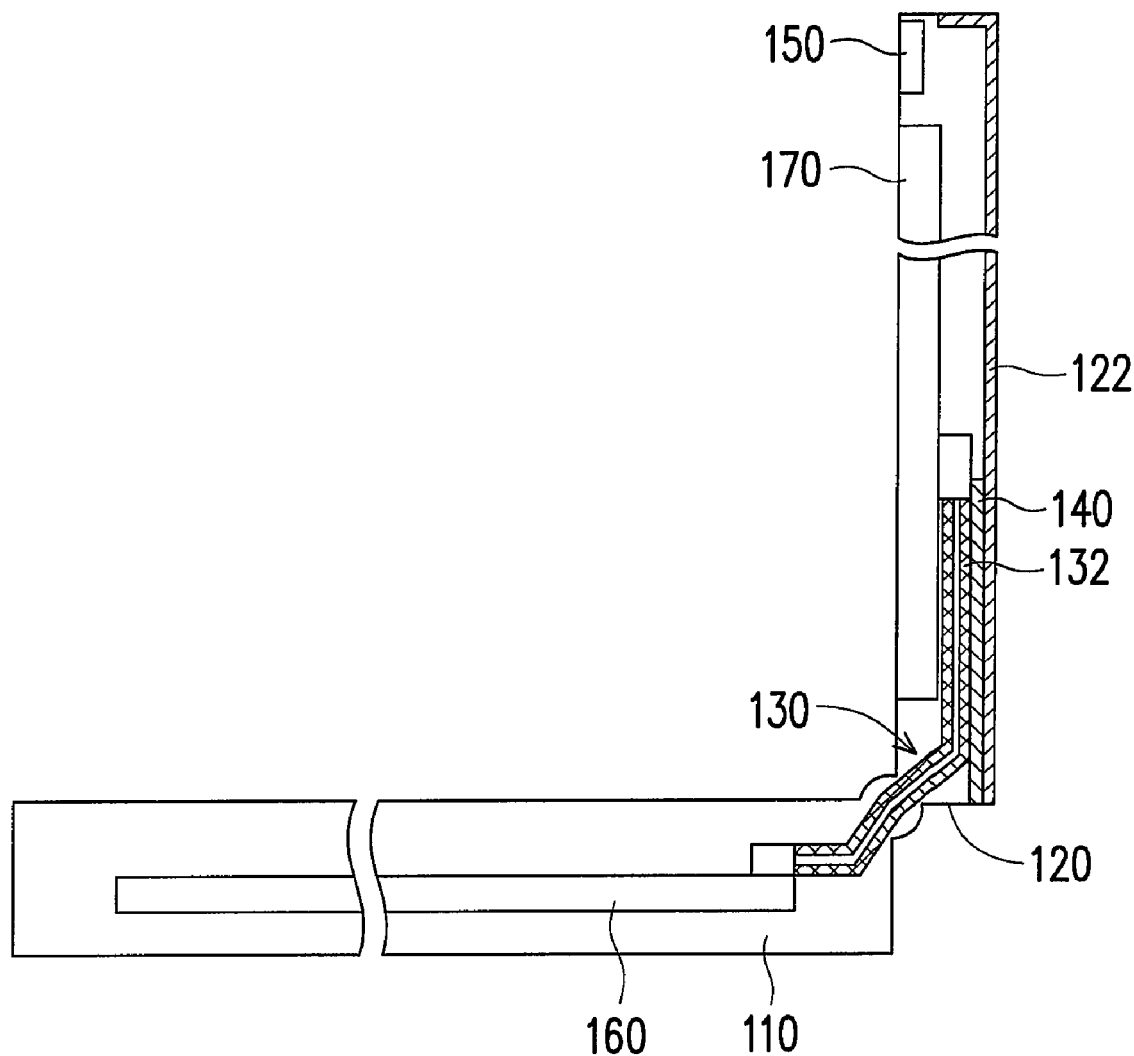
FIG. 1 is a cross-sectional view of an electronic device of one embodiment of the present invention.

FIG. 1 is a cross-sectional view of an electronic device of one embodiment of the present invention. Referring to FIG. 1, in the present embodiment, an electronic device 100 may be a notebook computer but not limited to this example. The electronic device 100 includes a first housing 110, a second housing 120, a signal cable 130, an insulating layer 140 and an antenna 150. The second housing 120 is connected to the first housing 110 and has a housing shielding layer 122 located on the inner surface of the second housing 120. The signal cable 130 extends from inside the first housing 110 into the second housing 120 and has a cable shielding layer 132 located on the outer surface of the signal cable 130. The insulating layer 140 is disposed between the housing shielding layer 122 and the cable shielding layer 132 so as to electrically insulate the housing shielding layer 122 from the cable shielding layer 132. The antenna 150 is disposed inside the second housing 120.

According to the aforementioned, the housing shielding layer 122 blocks the system noise sent out by the electronic device 100 so as to prevent the system noise from interfering with the operation of the antenna 150. However, if the housing shielding layer 122 contacts the cable shielding layer 132, the sensitivity of the antenna 150 in reception will be affected by the system noise inside the signal cable 130 sent out through the housing shielding layer 122 by radiation. Therefore, in the present embodiment, the insulating layer 140 is used to insulate the housing shielding layer 122 from the cable shielding layer 132 so as to prevent the housing shielding layer 122 from electrically contacting the cable shielding layer 132.

In the present embodiment, the first housing 110 is pivoted to the second housing 120. The housing shielding layer 122 is coupled to a radio frequency grounding and the cable shielding layer 132 is coupled to a digital grounding. Furthermore, the electronic device 100 may further include a mother board 160 and a display module 170. The mother board 160 is disposed inside the first housing 110, and the display module 170 is disposed inside the second housing 120. One end of the signal cable 130 located inside the first housing 110 is coupled to the mother board 160, and the other end of the signal cable 130 located inside the second housing 120 is coupled to the display module 170.

The housing shielding layer 122 may be a conducting material layer, such as a metal layer or an aluminum layer. The cable shielding layer 132 may also be made of a conducting material. The conducting material may be a metal layer or a metal net.

Figure 2:
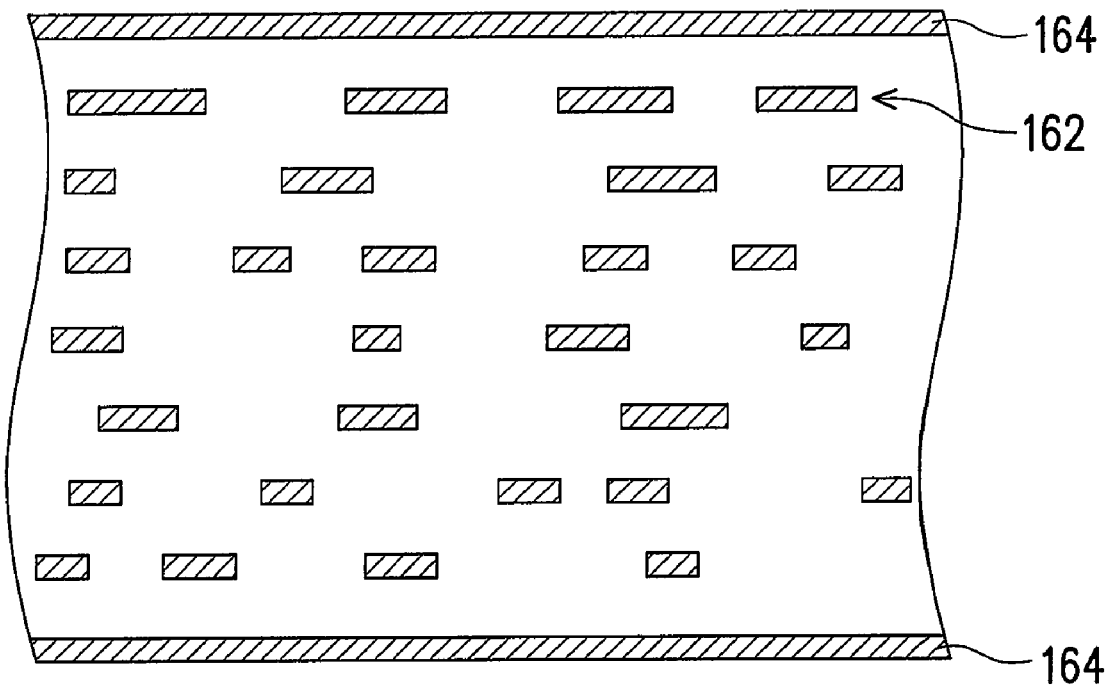
FIG. 2 is a locally enlarged view illustrating the mother board of FIG. 1.

FIG. 2 is a locally enlarged view illustrating the mother board of FIG. 1. Referring to FIG. 2, in order to enhance the shielding effect of the electronic device 100, more shielding can be added to the mother board 160 in the electronic device 100. Specifically, the mother board 160 in the electronic device 100 may have a high frequency digital signal circuit layer 162 and a reference plane 164, wherein the outer side of the high frequency digital signal circuit layer 162 corresponding to the mother board 160 is covered by the reference plane 164. The reference plane 164 may be a ground plane or a power plane. Thus, the noise generated by the high frequency digital signal circuit layer 162 is blocked by the reference plane 164 and does not affect the operation of the antenna 150.

Figure 3:
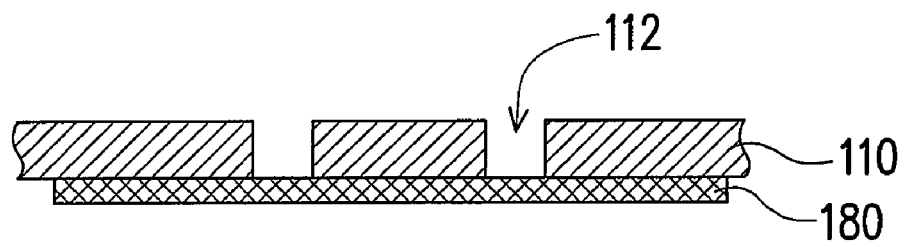
FIG. 3 is a locally enlarged cross-sectional view illustrating the electronic device of FIG. 1.

FIG. 3 is a locally enlarged cross-sectional view of the electronic device of FIG. 1. Referring to FIG. 3, the electronic device 100 has an opening 112 on the first housing 110 for installing elements such as a user operation interface. Since the opening 112 cannot be shielded by the housing shielding layer 122, a conducting net 180 may be further added to couple the conducting net 180 to a digital grounding. This method further reduces the influence of the system noise on the antenna 150. The conducting net 180 may be a metal net. Although the conducting net 180 is used as a shield in the present embodiment, people skilled in the art may replace the conducting net 180 with a conducting cloth and the conducting cloth may be a metal cloth. The conducting net 180 or the conducting cloth is disposed on the inner surface of the first housing 110 to cover the opening 112 so as to enhance the blocking of the system noise.

Referring to FIG. 1 again, a housing shielding layer 122 is located on the inner surface of the second housing 120 of the electronic device 100 so that the influence of the system noise on the antenna 150 is reduced. Moreover, the electronic device 100 has an insulating layer 140 disposed between the housing shielding layer 122 and the cable shielding layer 132. The insulating layer 140 prevents the housing shielding layer 122 from electrically contacting the cable shielding layer 132 so that the influence of the system noise on the sensitivity of the antenna 150 can be reduced.

To sum up, the present invention possesses at least the following advantages:

1. The insulating layer is disposed between the housing shielding layer and the cable shielding layer so as to prevent the housing shielding layer from electrically contacting the cable shielding layer so that the influence of the system noise on the sensitivity of the antenna can be reduced.

2. The high frequency digital signal circuit layer of the mother board is covered by the reference plane so that the noise generated by the high frequency digital signal circuit layer is blocked by the reference plane and does not affect the operation of the antenna.

3. The conducting net or the conducting cloth disposed on the opening of the housing further blocks the system noise and prevents the system noise from being given off from the housing.

It will be apparent to those skilled in the art that various modifications and variations may be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An electronic device comprising:

a first housing;

a second housing, connected to the first housing and comprising a housing shielding layer located on the inner surface of the second housing;

a signal cable, extended from inside the first housing into the second housing, and having a cable shielding layer located on the outer surface of the signal cable;

an insulating layer, disposed between the housing shielding layer and the cable shielding layer so as to electrically insulate the housing shielding layer from the cable shielding layer; and an antenna, disposed inside the second housing.

2. The electronic device as claimed in claim 1, further comprising:

a mother board, disposed inside the first housing and coupled to one end of the signal cable located inside the first housing.

3. The electronic device as claimed in claim 2, wherein the mother board has a high frequency digital signal circuit layer and a reference plane, and the outer side of the high frequency digital signal circuit layer corresponding to the mother board is covered by the reference plane.

4. The electronic device as claimed in claim 3, wherein the reference plane is a ground plane or a power plane.

5. The electronic device as claimed in claim 1, further comprising:
   a display module, disposed inside the second housing and coupled to one end of the signal cable located inside the second housing.

6. The electronic device as claimed in claim 1, wherein the second housing is pivoted to the first housing.

7. The electronic device as claimed in claim 1, wherein the housing shielding layer is coupled to a radio frequency grounding, and the cable shielding layer is coupled to a digital grounding.

8. The electronic device as claimed in claim 1, further comprising:
   at least a conducting net, set inside the first housing so as to cover an opening of the first housing.

9. The electronic device as claimed in claim 8, wherein the conducting net is coupled to a digital grounding.

10. The electronic device as claimed in claim 8, wherein the conducting net is a metal net.

11. The electronic device as claimed in claim 1, further comprising:
    at least a conducting cloth, set inside the first housing so as to cover an opening of the first housing.

12. The electronic device as claimed in claim 11, wherein the conducting cloth is coupled to a digital grounding.

13. The electronic device as claimed in claim 11, wherein the conducting cloth is a metal cloth.

14. The electronic device as claimed in claim 1, wherein the housing shielding layer is a metal layer.

15. The electronic device as claimed in claim 1, wherein the housing shielding layer is an aluminum layer.

16. The electronic device as claimed in claim 1, wherein the cable shielding layer is a metal layer.

17. The electronic device as claimed in claim 1, wherein the cable shielding layer is a metal net.

\* \* \* \* \*